United States Patent
Mukherjee-Roy et al.

(10) Patent No.: US 6,743,713 B2
(45) Date of Patent: Jun. 1, 2004

(54) METHOD OF FORMING DUAL DAMASCENE PATTERN USING DUAL BOTTOM ANTI-REFLECTIVE COATINGS (BARC)

(75) Inventors: Moitreyee Mukherjee-Roy, Singapore (SG); Vladimir N. Bliznetsov, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 10/146,276

(22) Filed: May 15, 2002

(65) Prior Publication Data
US 2003/0216026 A1 Nov. 20, 2003

(51) Int. Cl.$^7$ .......................................... H01L 21/4763
(52) U.S. Cl. ...................... 438/638; 438/622; 438/637; 438/700; 438/702
(58) Field of Search ................................ 438/638, 637, 438/640, 622, 687, 688, 700, 701, 702

(56) References Cited

U.S. PATENT DOCUMENTS

| 6,228,760 | B1 | 5/2001 | Yu et al. ..................... 438/636 |
| 6,251,774 | B1 | 6/2001 | Harada et al. ............... 438/637 |
| 6,265,294 | B1 | 7/2001 | Park et al. ................... 438/533 |
| 6,306,732 | B1 | 10/2001 | Brown ........................ 438/468 |
| 6,309,955 | B1 * | 10/2001 | Subramanian et al. ...... 438/618 |
| 6,380,096 | B2 * | 4/2002 | Hung et al. .................. 438/723 |
| 6,391,761 | B1 * | 5/2002 | Lui ............................. 438/618 |

OTHER PUBLICATIONS

"Making the Move to Dual Damascene Processing", Semi-conductor Int'l, pp. 79–81, Aug. 1997.
"Organic BARC Process Evaluation for Via First Dual Damascene Patterning", SPIE Microlithography, Feb. 2001, Cher–Huan Tan et al.

* cited by examiner

*Primary Examiner*—Jack Chen
*Assistant Examiner*—Thanhha Pham
(74) *Attorney, Agent, or Firm*—George O. Saile; Stephen B. Ackerman

(57) ABSTRACT

A method of forming a via-first type dual damascene structure in the absence of an etch stop layer and without via-edge erosion or via-bottom punch-through is described. The invention uses two organic films deposited within via hole prior to trench etching. A via hole over a lower level metal line is first etched in the dielectric film. Two, preferably organic, bottom anti-reflective coating (BARC) films, first one being the conformal type to coat the surfaces and the walls of the via and the second one being the planarizing type to at least partially fill the via, are then deposited. Using a mask aligned to via hole, a wiring trench of desired depth is etched in the top portion of the dielectric film. During trench etching, the conformal BARC-1 film protects the via-edges from eroding and the planarizing BARC-2 film prevents punch-through of the via-bottom. Desired metal such as aluminum or copper are deposited within said dual damascene pattern.

24 Claims, 3 Drawing Sheets

METHOD OF FORMING DUAL DAMASCENE PATTERN USING DUAL BOTTOM ANTI-REFLECTIVE COATINGS (BARC)

BACKGROUND OF THE INVENTION (1) Field of the Invention

The present invention relates generally to methods of forming dual damascene patterns and more particularly to methods of forming dual damascene patterns, without the use of etch stop layers, using dual bottom anti-reflective coating (BARC) films.

(2) Description of the Prior Art

Damascene is the practice of creating metal inlay patterns first developed by ancient artisans of Damascus, hence the word damascene. Single damascene and dual damascene patterns are essential today in the fabrication of metal wiring in semiconductor devices and integrated circuits. Dual damascene in particular offers a cost-effective method of forming copper interconnects since copper is hard to etch by a plasma process due to non-volatility of many of its reaction products. Damascene process as practiced today simply consists of etching a wiring trench in a dielectric film followed by filling the trench with metal such as aluminum or copper and then removing the excess metal by a planarizing process Dual damascene involves a second level, wherein a series of via holes are etched and filled by metal in addition to the trench.

Several methods of forming dual damascene patterns have been described in the prior art, and in particular three methods are described: self-aligned, trench-first, and via-first. Self-aligned method has already via patterned and embedded in an intermediate layer. Via hole and trench are etched at the same time. However, this method requires a thick intermediate layer as a trench etch stopper and requires precise alignment accuracy during lithography. Trench-first method is not a very manufacturable process since it requires a thick photo-resist to be able to etch via pattern through an already etched wiring trench; and it is hard to develop a via pattern in thick resist. Via-fist has two approaches: with and without an etch stop layer. In the via-first without an etch stop layer, via is etched first and the trench second. However, trench etch has to be stopped somewhere in the middle of the dielectric. This is practical only if the etch rate uniformities are very good. Secondly, it may be difficult to remove all the photo-resist within via.

In the via-first with an intermediate etch-stop layer, most of the above problems are resolved, while creating a new one. The silicon nitride that is used as an etch stop layer, having a high dielectric constant, is left in place in the structure and increases the overall capacitance when a low-k material is used as the inter-level dielectric. Circuit performance in terms of speed (RC delay) is degraded as a result. All these methods while offering certain advantages also suffer from problems unique to each method.

Two factors are important in fabricating via-first dual damascene structures, particularly when an intermediate etch stop layer is not used: i) via bottom needs to be protected from punch through during trench etch and ii) via edges at the top need to be protected from eroding during trench etch. Anti-reflection coating (ARC) materials have been used in prior art to overcome these problems with only partial success. While conformal ARCs and BARCs alone protect via edges, they cannot prevent punch-through of via bottom, particularly when etch selectivity to the underlying layer is not high enough. Planarizing ARCs and BARCs alone, on the other hand, protect the via-bottom but cannot protect the via-edges due to poor step coverage of the coating around the edges.

Some of these methods and associated problems with each method are described in a paper, *Making the Move to Dual Damascene Processing*, published in Semiconductor International, p. 79, August 1997 and in a paper, *Organic BARC Process Evaluation for Via First Dual Damascene Patterning*, in SPIE Microlithography, February 2001.

U.S. Pat. No. 6,228,760B1 describes a method of covering micro-scratches that are produced in a dielectric layer after chemical mechanical polishing, of a metal interconnect film in a via plug structure. A protective layer of dielectric anti-reflection coating (DARC) or SiON layer is deposited to cover the micro-scratches. To form the metal interconnect pattern, opening is etched in the protective layer and in the dielectric layer. The pattern is then filled with the conductive layer and chemical-mechanically polished to remove the excess conductor layer. The protective layer also serves as a polish stop to prevent new scratches being formed in the dielectric layer.

U.S. Pat. No. 6,251,7741B1 describes a method of manufacturing a semiconductor device to form a metal interconnect in a via-first type of dual damascene structure on a lower metal pattern without damaging the lower wiring layer. According to the process, a first silicon nitride film, a first silicon oxide film, a second silicon nitride film, and a second silicon oxide film are sequentially deposited on the lower wiring layer. A via hole is etched above the wiring layer, passing through the top two layers. A photo resist is filled within via so as to cover the internal wall surface and BARC material is then deposited over the oxide. BARC film is used to enhance the performance of the lithographic step in defining the trench mask pattern with superior dimensional accuracy. Wiring trench is then etched while the resist in via protects the first silicon nitride film from punch-through. Via steps, however, are not adequately protected.

U.S. Pat. No. 6,306,732B1 describes an apparatus and method for improving electro-migration reliability and resistance of a single or dual damascene via by using an imperfect barrier film at the bottom of the via and a strong barrier formed at all other portions of the via. The imperfect barrier allows for metal atoms to flow through when electro-migration force pushes the metal atoms against the barrier film.

U.S. Pat. No. 6,265,294 describes a fabrication method to reduce the amount of discoloration on inter-level dielectric layers due to anti-reflection coatings (ARCs). This patent uses a barrier layer such as silicon nitride to prevent the ARC from coming in contact with the inter-level dielectric film. The ARCs used are of the inorganic type such as silicon oxy-nitride (SiON).

SUMMARY OF THE INVENTION

Accordingly, it is a primary object of the invention to describe a method to form a via-first dual damascene wiring pattern, without punch-through of the via-bottom or erosion of via-corners.

It is yet another object of the invention to describe a method of forming a via-first dual damascene wiring pattern, using two layers of two different types of bottom anti-reflective coating films within the via prior to etching of the wiring trench.

Yet another object of this invention is to describe a method of forming a via-first dual damascene pattern, without the use of an intermediate etch stop layer.

In accordance with these objectives, a method is described to form a via-first dual damascene structure, in the absence of an etch stop layer, without punch-through of via bottom or eroding via corners during etching of wiring trench. Over metal wiring protected by a barrier film, an inter-level dielectric film is deposited and via is etched in the dielectric film stopping on the barrier layer. Via walls and surfaces are then conformally coated with a first type of BARC film, which protects via step during etching. Via pattern is further filled, partially or fully, with a second, planarizing type of BARC material. Wiring trench pattern is then formed using a trench resist mask and plasma etching process. The two BARC films together protect both the via-bottom and via-corners during trench etching. Stripping the mask and BARC films at the same time and cleaning any of the organic BARC residues in the pattern complete the process.

DESCRIPTION OF THE PREFERRED EMBODIMENTS

Figure 1:
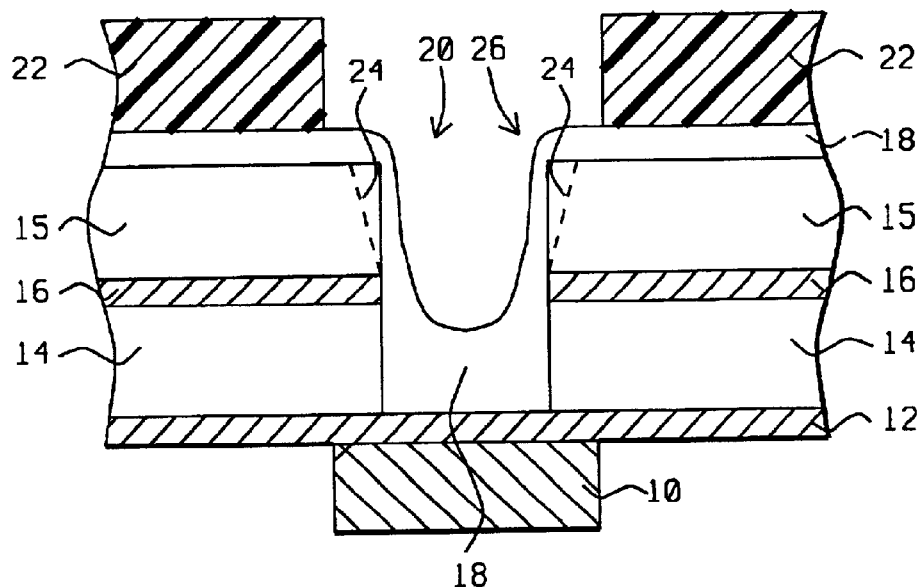
FIG. 1 is a cross-sectional view, showing the formation of a via-first damascene structure according to prior art when an etch stop layer and planarizing BARC only are used.

Referring to FIG. 1, there is shown a partially formed damascene structure with via etched first according to prior art. A metal line 10 is shown on which is deposited a barrier layer 12, inter-level dielectric films 14 and 15 with an etch stop later 16 in-between, planarizing BARC 18 partially filled in via 20. It is to be noted that the BARC film thickness over the via-edge 26 is quite thin (shown by arrow), providing poor step coverage during subsequent wiring trench etch. After trench resist mask 22 is aligned to the via-top, trench pattern is etched in the top dielectric film 15 such that etching stops on etch-stop layer 16. When trench pattern is etched, due to non-uniformities in film thickness and etch rate, via-edges get eroded when trenches over the whole wafer are etched to completion (i.e. to stop on the etch stop layer 16). The eroded via-edges are shown by dotted lines 24.

FIGS. 2 through 6 describe the process flow for forming via-first dual damascene pattern, according to the present invention.

Figure 2:
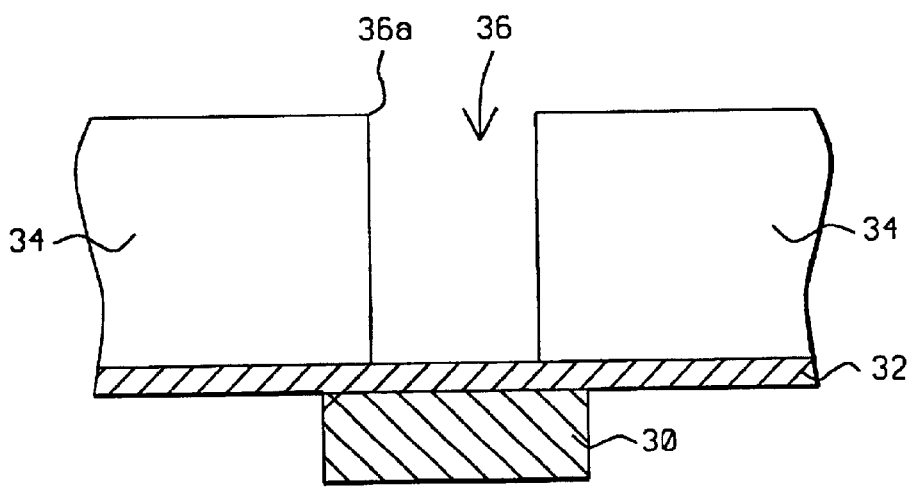
FIG. 2 is a cross-sectional view, showing a via hole etched into an inter-level dielectric film deposited over a barrier film on top a metal line.

Referring to FIG. 2, there is shown a first metal line 30 on which is deposited a barrier layer 32 and an inter-level dielectric (ILD) film 34 in which via 36, with via-edge 36a, has been formed using standard lithography and plasma etching methods known in prior art. ILD films can be of either organic or inorganic materials. Organic type materials include: porous or non-porous polymers such as, polytetrafluoro ethylene (PTFE), polyimide, low-k materials like SiLK, (Manufacturer: The Dow Chemical Company, Midland, Mich.), poly arylenes, cyclotenes, and teflons, and/or polyimide nanofoams. The inorganic and hybrid (combination of inorganic and organic components) type materials include: silicon dioxide, silicon oxy-fluoride (SiOF or FSG), spin-on glass (SOC), nanoporous silica, organo-silicate glass (OSG), methyl silsesquioxane (MSQ), hydrogen silsesquioxane (HSQ), and/or silica aerogels. The thickness of film 34 approximately equals the depth of the final stud via plus the thickness of the second interconnecting metal line (or the trench depth). Barrier layer 32, which is usually an inorganic film such as silicon nitride or silicon oxy-nitride, is deposited to protect the underlying metal 30 from being attacked during etching of trench pattern. Film 32 has a thickness of approximately between about 500 and 700° A. Although in the preferred embodiment ILD film 34 is formed of a single material, it can be formed of two or more ILD layers of slightly differing properties. However, no etch stop layer is used in this invention.

Figure 3:
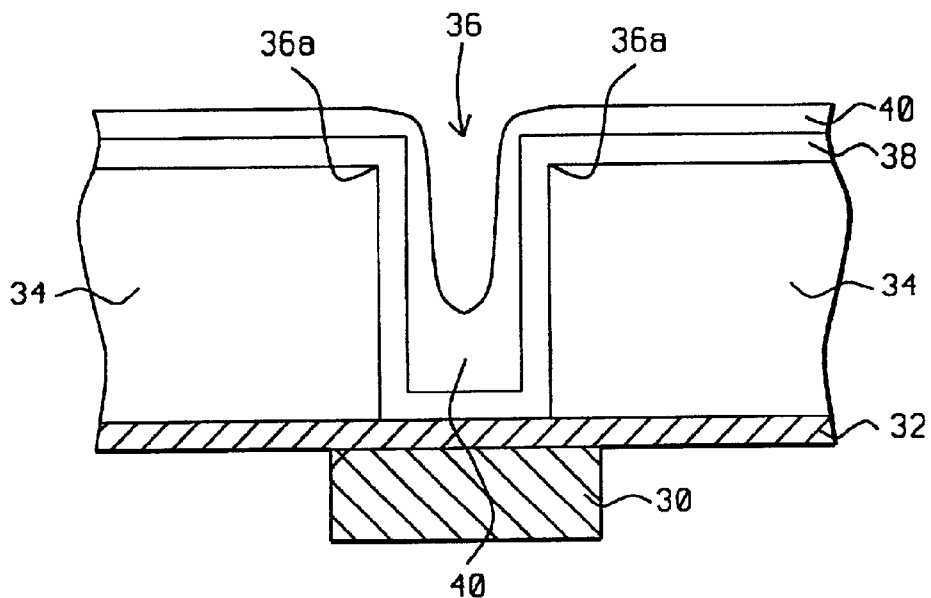
FIG. 3 is a cross-sectional view of via showing conformally deposited BARC-1 film and planarizing BARC-2 material partially filling via pattern.

Referring to FIG. 3, there are shown two BARC films deposited within said via 36 of FIG. 2. BARC-1 film 38 that can be formed of an inorganic or organic type of material is deposited preferably in a conformal manner. However, in this preferred embodiment, an organic material with a thickness of approximately about 600–700° A is conformally deposited using a spin coating process. BARC-1 film when correctly deposited (either fully conformal or partially conformal with adequate via-step coverage) protects the via-edge 36a during trench etching. The conformal BARC material is designed to have higher viscosity and longer molecular structure to facilitate conformal deposition so as to adequately cover via surface, corners, edges, and via walls. For optimal conformal deposition, the viscosity of BARC-1 is adjusted to be in the range of approximately between about 9 and 20 centipoises. Although the preferred film in this embodiment is a proprietary material AR3 (Manufacturer: Shipley-SVC, Sunnyvale, Calif. 94086) as it is called in the trade, one who is skilled in the art can readily substitute AR3 with alternate materials, without departing from the spirit of the invention Examples of some of these alternate BARC-1 films are deep UV BARC materials such as DUV42 (Manufacturer. Brewer Science, Inc., Rolla, Mo. 65401, USA).

Following the deposition of BARC-1, a second BARC-2 film 40, which is an organic material in this preferred embodiment and of the planarizing type (i.e. easily fills via holes) is then applied, such that the film partially fills the via as shown or completely fills to give a planar structure (not shown). It is to be noted here that the step coverage achieved due to BARC-1 and BARC-2 films around via edge is greatly improved when compared to step coverage achieved in prior art, as shown by arrow in FIG. 1. Although proprietary material with trade name DUV32-J (Manufacturer; Brewer Science Corporation, Inc., Rolla, Mo. 65401, USA) is used as BARC-2 film, other suitable materials can be substituted without departing from the spirit of the invention. Examples of other BARC-2 films are DIJV-32 and/or NCA-273 (Manufacturer; Brewer Science Corporation, Inc., Rolla, Mo. 65401, USA). In both methods of via filling (i.e. partial fill or complete fill), via-bottom is adequately protected from punch-through of the barrier film 32 during trench etching.

Figure 4:
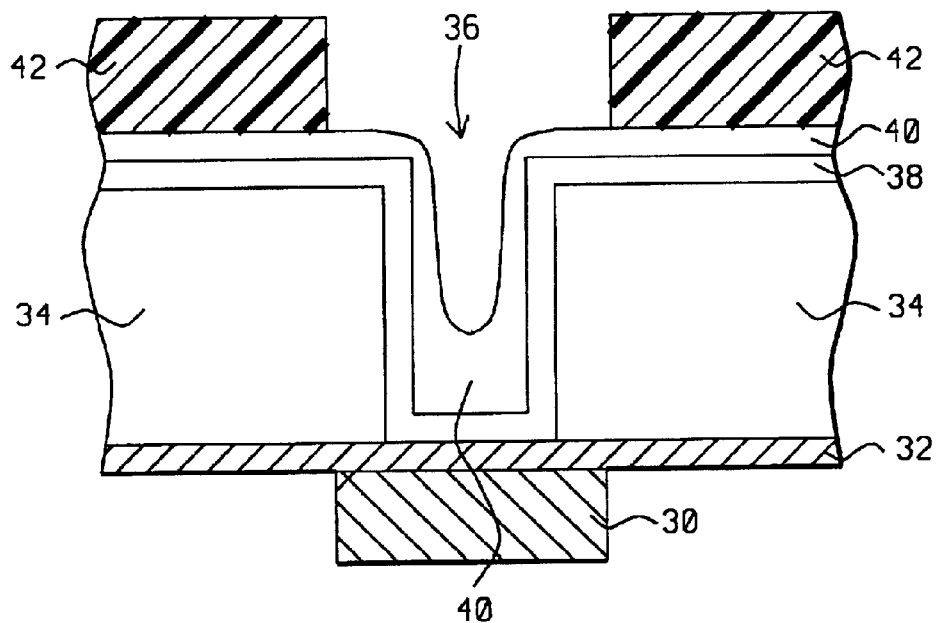
FIG. 4 is a cross-sectional view of via pattern, showing a resist mask with trench pattern defined.

Referring now to FIG. 4, there is shown a resist mask 42 aligned to via 36 and with the trench pattern developed in it, using conventional methods of lithography known in prior art. The two BARC films 38 and 40 also serve as anti-reflective coatings for precision resist patterning with improved dimensional control.

Figure 5:
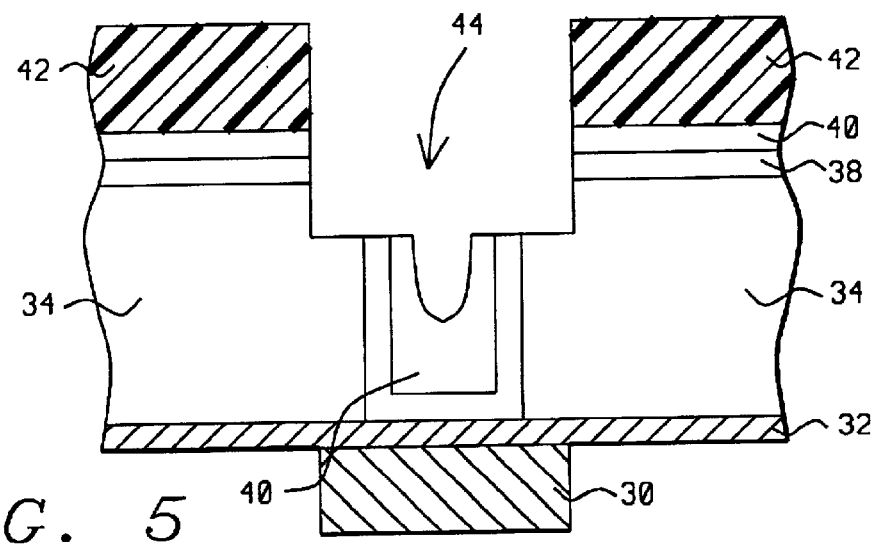
FIG. 5 is a cross-sectional view of dual damascene pattern, showing the trench pattern etched in the upper part of the inter-level dielectric film.

Referring to FIG. 5, there is shown a trench pattern 44 etched in the top part of inter-level dielectric film 34 and to the required depth (approximately equals the metal line thickness required), using an anisotropic plasma etching in a magnetically enhanced reactive ion etching reactor. The bottom portion of via pattern remains partially filled with BARC-2 film 40 as shown. Due to the presence of BARC-1 that protects via-walls near the edges, via profile remains vertical with no erosion during trench etching step. It is to be noted that the plasma etching process used depends upon material types of the ILD film 34 and the BARC films 38 and 40. For example, if both ILD and BARC films are organic, then the etching process should be such as to etch the ILD film and not to significantly etch the BARC films. Similar requirements hold if the ILD and BARC films are both inorganic materials.

Figure 6:
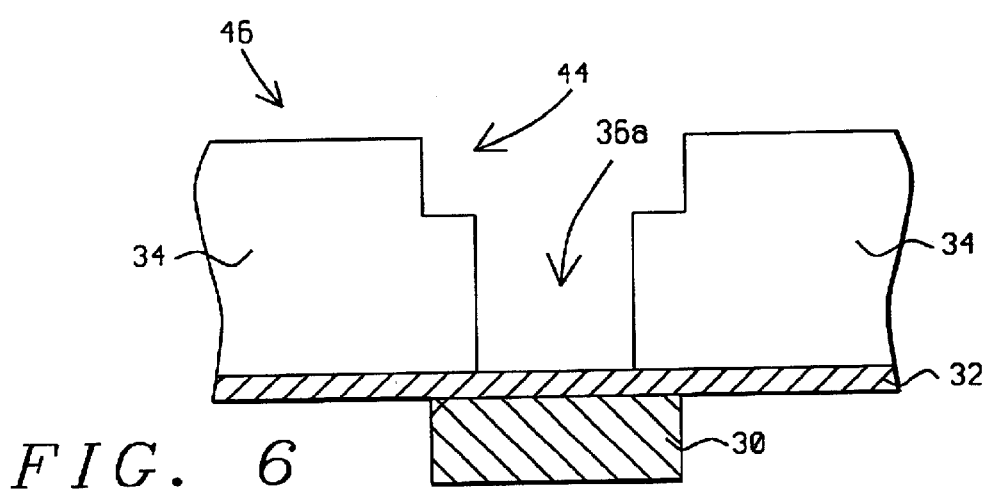
FIG. 6 is a cross-sectional view of final dual damascene pattern after the resist mask and residual BARC films have been removed.

FIG. 6 shows the final via-first dual damascene structure 46, with trench 44 positioned over the remaining via portion 36a, after the resist mask has been stripped off, during which time the BARC-1 and BARC-2 films are removed as well. Any remaining BARC residues are removed by slightly longer stripping or by addition of a dry or wet cleaning process known in prior art.

Figure 7:
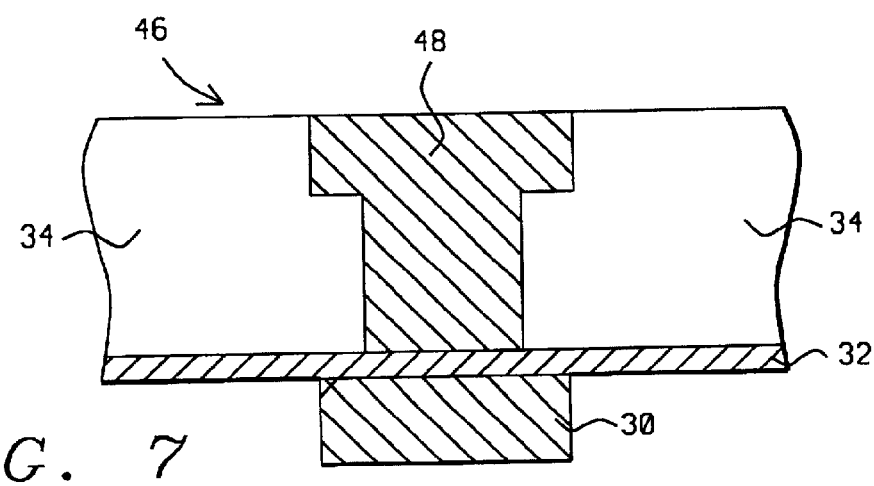
FIG. 7 is a cross-sectional view of dual damascene metal pattern formed according to the invention.

FIG. 7 shows the metal pattern 48 formed in the dual damascene structure 46, after depositing a metal such as aluminum or copper, using deposition methods: chemical vapor deposition, sputter deposition, ionized metal deposition, force-fill, electroplating, or electro-less plating, known in prior art.

The advantages of the present invention, using dual BARC films to form dual damascene structures without the use of an etch stop layer, are summarized as follows:

Using dual BARC films achieve well defined vertical etch profiles of both wiring trench and via.

Good profile and dimensional control of damascene pattern is achieved without using any etch stop layer, thereby maintaining the low-k value of the inter-level dielectric Optimal selection and optimizing the thickness of BARC films eliminates via edge erosion, via bottom punch-through, and polymer rails.

While the invention has been particularly shown with reference to the preferred embodiment thereof, it will be understood by those skilled in the art that various changes may be made in form and details without departing from the spirit and scope of this invention.

What is claimed is:

1. A method of forming a dual damascene pattern, the method comprising:

providing a substrate having a metal line and a barrier film on top of said metal line;

depositing an inter-level dielectric film on said barrier film;

forming a via hole through said inter-level dielectric film to said metal line;

depositing a BARC-1 layer to coat the surfaces of said via hole, said BARC-1 layer being formed of an organic conformal bottom anti-reflective coating material to protect edges of said via hole;

depositing a planarizing BARC-2 layer on said BARC-1 layer to fill said via hole, said planarizing BARC-2 layer being formed of an organic planarizing bottom anti-reflective coating material to protect the barrier film from punch through, said organic planarizing bottom anti-reflective coating material being different from said conformal bottom anti-reflective coating material;

forming a wiring trench pattern in the upper part of said inter-level dielectric film; and forming dual damascene pattern after stripping and cleaning said two BARC films.

2. The method of forming a dual damascene pattern according to claim 1, wherein said inter-level dielectric film is composed of one or more layers of an organic material.

3. The method of forming a dual damascene pattern according to claim 2, wherein said inter-level organic dielectric film comprises one or more of the following: polytetrafluoroethylene (PTFE), polyimide, polyimide hybrids, poly arylene and cyclotenes, teflons, and polyimide nano-foams.

4. The method of forming a dual damascene pattern according to claim 1, wherein said inter-level dielectric film is composed of one or more layers of inorganic and hybrid materials.

5. The method of forming a dual damascene pattern according to claim 4, wherein said inter-level inorganic and said hybrid materials comprise silicon dioxide, silicon oxyfluoride (SiOF or FSG), spin-on glass (SOG), nanoporous silica, organo silicate glass (OSG), silica aerogels, methyl silsesquioxane (MSQ), and hydrogen silsesquioxane (HSQ).

6. The method of forming a dual damascene pattern according to claim 1, wherein said BARC-1 film has a thickness of between about 600 and 700° A.

7. The method of forming a dual damascene pattern according to claim 1, wherein said BARC-1 material has a viscosity of approximately between about 9 and 20 centipoises.

8. The method of forming a dual damascene pattern according to claim 1, wherein said BARC-1 material is deposited in said via-hole in a partially conformal manner or in a fully conformal manner.

9. The method of farming a dual damascene pattern according to claim 1, wherein said BARC-2 film fills said via-hole completely.

10. The method of forming a dual damascene pattern according to claim 1, wherein said BARC-2 film fills via-hole only partially.

11. A method of forming a via-first dual damascene pattern with the use of two bottom anti-reflective coating (BARC) films; the method comprising:

providing a substrate having a metal line and a barrier film on top of said metal line;

forming an inter-level dielectric film on said barrier film, forming a via hole through said inter-level dielectric film to said metal line, forming a BARC-1 layer to coat the surfaces of said via hole, said BARC-1 layer being formed of an organic conformal bottom anti-reflective coating material to protect edges of said via hole;

forming a planarizing BARC-2 layer on said BARC-1 layer to fill said via hole, said planarizing BARC-2 layer being formed of an organic planarizing bottom anti-reflective coating material to protect the barrier film from punch through, said organic planarizing bottom anti-reflective coating material being different from said conformal bottom anti-reflective coating material;

forming a metal wiring trench pattern in the upper part of the said inter-level dielectric film, forming said dual damascene pattern after stripping and cleaning the said two BARC films; and filling said dual damascene pattern with metal.

12. The method of forming a via-first dual damascene pattern according to claim 11, wherein said inter-level dielectric film is composed of one or more organic, or inorganic, or hybrid materials layers.

13. The method of forming a via-first dual damascene pattern according to claim 12, wherein said inter-level organic material comprises poly-tetrafluoroethylene (PTFE), polyimide, polyimide hybrids, poly arylene and cyclotenes, teflons, and polyimide nanofoams.

14. The method of forming a via-first dual damascene pattern according to claim 12, wherein said inter-level inorganic and hybrid materials comprise silicon dioxide, silicon oxy-fluoride (SiOF or FSG), spin-on glass (SOG), nanoporous silica, organo silicate glass (OSG), silica aerogels, methyl silsesquioxane (MSQ), and hydrogen silsesquioxane (HSQ).

15. The method of forming a via-first dual damascene pattern according to claims 11, wherein said BARC-1 material has a film thickness of between about 600 and 700° A.

16. The method of forming a via-first dual damascene pattern according to claim 11, wherein said BARC-1 material is deposited in said via-hole in a partially conformal manner or in a fully conformal manner.

17. The method of forming a via-first dual damascene pattern according to claim 11, wherein said BARC-2 film fills said via-hole completely or partially.

18. The method of forming a via-first dual damascene pattern according to claim 11, wherein said metal is aluminum or copper.

19. A method of forming a via-first dual damascene pattern without using an etch stop layer; the method comprising:

providing a substrate having a metal line and a barrier film on top of said metal line;

forming an inter-level organic, inorganic or hybrid dielectric film on said barrier film without providing an etch stop layer;

forming a via hole through said inter-level dielectric film to said metal line;

forming a BARC-1 layer to coat the surfaces of said via hole, said BARC-1 layer being formed of an organic conformal bottom anti-reflective coating material to protect edges of said via hole;

farming a planarizing BARC-2 layer on said BARC-1 layer to fill said via hole, said planarizing BARC-2 layer being formed of an organic planarizing bottom anti-reflective coating material to protect the barrier film from punch through said organic planarizing bottom anti-reflective coating material being different from said conformal bottom anti-reflective coating material;

forming a wiring trench pattern in the upper part of said inter-level dielectric film; and forming the dual damascene pattern after stripping and cleaning said two BARC films.

20. The method of forming a via-first dual damascene pattern according to claim 19, wherein said inter-level organic dielectric film comprises poly-tetrafluoroethylene (PTFE), polyimide, polyimide hybrids, poly arylene and cyclotenes, teflons, and polyimide nanofoams.

21. The method of forming a via-first dual damascene pattern according to claim 19, wherein the said inter-level inorganic and hybrid dielectric films comprise silicon dioxide, silicon oxy-fluoride (SiOF or FSG), spin-on glass (SOG), nanoporous silica, organo silicate glass (OSG), silica aerogels, methyl silsesquioxane (MSQ), and hydrogen silsesquioxane (HSQ).

22. The method of forming a via-first dual damascene pattern according to claim 19, wherein said BARC-1 material has a film thickness of between about 600 and 700° A.

23. The method of forming a via-first dual damascene pattern according to claim 19, wherein said BARC-1 material is deposited in a partially conformal manner or preferably in a fully conformal manner.

24. The method of forming a via-first dual damascene pattern according to claim 19, wherein said BARC-2 film fills said via-hole completely or partially.

* * * * *